United States Patent [19]
Moran et al.

[11] Patent Number: 5,654,044
[45] Date of Patent: Aug. 5, 1997

[54] DIAMOND FILM DEPOSITION ON GRAPHITE

[75] Inventors: Mark B. Moran, Ridgecrest, Calif.; Karl A. Klemm, Largo, Fla.; Linda F. Johnson, Ridgecrest, Calif.

[73] Assignee: The United States of America as represented by the Secretary of the Navy, Washington, D.C.

[21] Appl. No.: 520,453

[22] Filed: Aug. 29, 1995

[51] Int. Cl.$^6$ .................................................... C23C 16/26
[52] U.S. Cl. .......................... 427/577; 427/532; 427/249; 427/255.7
[58] Field of Search ..................... 427/577, 532, 427/597, 249, 255.7; 423/446

[56] References Cited

U.S. PATENT DOCUMENTS

| | | | |
|---|---|---|---|
| 5,114,745 | 5/1992 | Jones | 427/113 |
| 5,169,676 | 12/1992 | Moran et al. | 427/575 |
| 5,374,414 | 12/1994 | Morrish et al. | 423/446 |
| 5,491,002 | 2/1996 | Slutz | 427/249 |
| 5,527,559 | 6/1996 | Simpson | 427/249 |

*Primary Examiner*—Shrive Beck
*Assistant Examiner*—Timothy Meeks
*Attorney, Agent, or Firm*—Melvin J. Sliwka; Stephen J. Church

[57] ABSTRACT

A continuous, adhering film of polycrystalline diamond is grown on a graphite substrate from diamond crystallites nucleated at a metal layer on the substrate when subjected to a microwave activated plasma of hydrogen and a carbon containing gas. Pyrolytic graphite and cured graphite adhesive are effective and other forms of graphite may be effective. Effective metals are chromium, nickel, and titanium. Diamond nucleation apparently occurs at crystallites of metal carbides nucleated by carbon from the plasma so that other carbide forming metals may be effective. Metal not nucleated as the carbide is, apparently, etched away by the plasma; and the diamond film is effectively deposited directly on the graphite since the diamond film is not contaminated by the metal even at the graphite interface where carbide contamination was less than 0.2 percent from a 2500 Å chromium film. The diamond film deposition occurs at substrate temperatures as low as 650° C. and may be facilitated by a positive voltage bias of the substrate relative to an enclosing vacuum chamber wall. Partial coating of a graphite surface with the metal results in diamond deposition only at the coated portion. A grid of diamond film has thus been deposited on graphite by application of a nickel screen to the graphite, and diamond film may be deposited in a desired pattern by masking the substrate to deposit the metal at selected substrate portions.

6 Claims, No Drawings

DIAMOND FILM DEPOSITION ON GRAPHITE

BACKGROUND OF THE INVENTION

1. Field of the Invention

The present invention pertains to coating processes using catalyzed vapor deposition of diamond.

2. Description of the Prior Art

The use of the carbon allotrope diamond is highly desirable as a temperature, impact, and abrasion resistive coating that is also highly heat conducting and has low friction. The development of chemical vapor deposition (CVD) for diamond films from a carbon containing plasma has resulted in the practical application of diamond films for these uses on electrically conducting or semiconducting materials. However, CVD deposition of diamond has been ineffective on the electrically conductive carbon allotrope graphite since any carbon deposited is in the form of additional graphite.

Even on materials on which the prior art deposition is effective, the prior art temperatures of 850°–1100° C. damage many potentially desirable substrate materials and result in the diffusion of dopants from deposited diamond and the diffusion of deleterious materials from the substrate into the diamond.

It is thus highly desirable to provide a diamond deposition method which extends the benefits of diamond films to graphite.

SUMMARY AND OBJECTS OF THE INVENTION

The present invention provides for the deposition of a continuous, adhering film of polycrystalline diamond directly on a graphite substrate by first depositing a thin film of a metallic element on the substrate and then subjecting the substrate to a plasma formed by activation, as by microwave energy in a vacuum chamber, of a mixture of hydrogen and a carbon containing gas or vapor. In general, the deposition is in accordance with known chemical vapor deposition (CVD) techniques except that substrate temperatures less than 850° C. and as low as 650° C. are employed. The metals chromium, titanium, and nickel have been found effective for purposes of the present invention and it is believed that any metallic element that forms a carbide when subjected to such plasma may be effective. The effectiveness of these metals for deposition of diamond film on graphite, in accordance with the present invention and as shown by the examples below, is (best to worse) chromium, nickel, and titanium although all were effective. Deposition of a diamond film on graphite in accordance with the present invention is effective on bulk pyrolytic graphite and on graphite formed by molded graphite adhesive and is believed effective on graphite formed by other techniques.

Diamond coatings applied to graphite in accordance with the present invention are believed useful to prevent crumbling and abrasion damage to "bricks" of amorphous graphite commonly used for their refractory and other properties and to coat graphite "whiskers" used in composite materials to provide even greater strength for such materials.

Deposition of a polycrystalline diamond film on graphite is facilitated when performed accordance in accordance with applicants discovery that initial nucleation of diamond crystallites on and adherent to a substrate is facilitated from a carbon containing plasma when the substrate is maintained at a positive electric potential relative to a vacuum chamber wall enclosing the plasma. Such a bias potential of about 25 volts is particularly effective for the purposes of the present invention and can provide a polycrystalline diamond film having crystallites of smaller size than if the substrate is not so biased. Maintaining the substrate at a negative such bias, such as about –25 volts, has been found to inhibit nucleation of diamond crystallites on graphite in accordance with the present invention. Discovery of the effects of such bias potential and its utilization are also set forth in a copending application by the present applicants titled "Metal Initiated Nucleation of Diamond" which was filed Ser. No. 08/530,388, filed 3 Aug. 1995. This copending application is directed to deposition of diamond films on nonconducting and other substrates at low temperatures by providing the plasma with atoms of a metallic element with deposition occurring, in contrast to the present invention, on substrate portions not having a coating of the metallic element.

The belief of those skilled in the CVD art is that diamond does not nucleate directly on graphite, although graphite is a relatively good conductor and although the usual, higher prior art temperatures for CVD diamond deposition are employed, because carbon from the plasma is, as before stated, deposited as additional graphite rather than nucleating as diamond crystallites. However, when in accordance with the applicants' discovery that initial nucleation of diamond crystallites on and adherent to graphite is facilitated from a carbon containing vapor activated, as by micro-wave energy, to form a plasma, a layer of metal is disposed on the graphite substrate and then CVD is carded out using such a plasma, diamond nucleates and polycrystalline diamond film growth occurs on the graphite substrate where provided with the metal layer instead of on any substrate region uncoated with the metal. The present invention thus provides for selective or patterned deposition, as by masking, of diamond film.

Once nucleation of diamond crystallites is initiated on a substrate surface in accordance with the present invention, further deposition by growth of these crystallites and additional nucleation on existing crystallites provides a continuous film adherent to the substrate.

It believed that diamond crystallite nucleation on graphite at a metal layer applied to the graphite occurs in accordance with the present invention at crystallites of the carbide of the metal formed from carbon in the plasma. This is indicated in Example 3 below where chromium carbide apparently formed on the graphite substrate as indicated by a gold color on the substrate where visible through the few void regions in the deposited diamond film. When such carbide crystallites form, diamond crystallites then nucleate on the carbide crystallites because of the similarity of the carbide and diamond crystal structures, and an adherent diamond film may then be grown on the graphite from the initial diamond crystallites. The diamond film is, in effect, deposited directly on the graphite substrate since it is believed that there only needs to be a sufficient number of the carbide crystallites to connect the diamond film to the graphite and since the metal not nucleated as the carbide is, apparently, etched away by the hydrogen plasma.

The result of diamond film deposition in accordance with the present invention is thus not deposition of the diamond over the relatively thin metal layer or film, but deposition of diamond directly on the graphite. This is indicated by Auger spectroscopy and Rutherford backscattering spectroscopy of diamond films grown in accordance with the present invention on a chromium layer of 2500 Å thickness deposited on graphite has shown that any contamination of the diamond films by the chromium, even at the interface between the diamond and the substrate, is less than 0.2 atomic weight percent.

In developing the present invention, diamond films were deposited on graphite using chromium films of 300 Å and 2500 Å and titanium and nickel films of 2500 Å thickness. The upper limit of metal film thickness was not determined; however as pointed out elsewhere in this application, it is known that diamond film CVD is not practical on bulk chromium metal.

Another reason why diamond crystallite nucleation on graphite occurs in accordance with the present invention may be as indicated in Example 11 below where Raman spectra were taken of a diamond film and of a substrate of graphite adhesive. The Raman spectrum of the diamond showed a single peak at 1324 $cm^{-1}$ which is consistent with highly stressed diamond since stresses in diamond can cause a shift to a lower wavenumber from the usual Raman peak centered at about 1332 $cm^{-1}$ for polycrystalline diamond. A section of the diamond film was removed, and the portion of the graphite substrate just beneath the diamond exhibited the crystalline graphite Raman spectrum with a sharp peak centered at 1580 $cm^{-1}$, a change from the initial graphite surface spectrum which had the broad peak centered at 1520 $cm^{-1}$ consistent with amorphous graphite. Apparently, application of the nickel coating and CVD diamond film deposition in accordance with the present invention had changed the top surface of the amorphous graphite to crystalline graphite which may have facilitated nucleation of diamond on the graphite.

The results obtained by the present invention are believed surprising, because CVD of diamond on bulk metals, including chromium, is ineffective—perhaps because, at least with microwave activation of the plasma, the metal temperature rises above 1100° C. which is too high for diamond deposition. These results are also believed surprising in that the resulting film is adherent to the graphite because, although diamond films have been grown from microwave activated plasma on the carbide forming element molybdenum, the resulting films do not adhere to the molybdenum.

Diamond films are effectively deposited in accordance with the present invention when the graphite substrate is at temperatures in the range of 650°–850° C. in contrast to the substrate temperatures of 850°–1100° C. usually required for prior art CVD diamond film deposition. In the practice of the present invention, diamond crystallite nucleation decreased as substrate temperatures were increased from 650° C. toward 850° C. As a result, substrate temperatures above 850° C. were not tried. It has been found that these lower temperatures may be maintained by heating from the activated plasma without use of additional substrate heating. In fact, active cooling of a graphite substrate on which diamond is being deposited in accordance with the present invention may be required to maintain the substrate at a temperature in the range of 650°–850° C. However, once diamond film nucleation is initiated on graphite by use of a metal applied to the graphite in accordance with the present invention, it may be possible or, in some circumstances, even desirable to continue diamond film growth with the higher prior art temperatures.

The present invention has been used to deposit continuous, adherent diamond films on graphite substrates provided as pyrolytic graphite and molded from graphite adhesive. As set forth below, such adhesive is commercially available and is formed from a mixture of graphite powder and a binder, which may include an organic solvent and a metallic catalyst. Curing of the mixture at temperatures of 130° C. and 100° C. causes the solvent to evaporate and the graphite powder to bond by graphite to graphite bonds leaving solid graphite of 99.9% purity.

Since, in diamond film deposition on graphite in accordance with the present invention a diamond film is deposited where the graphite is provided with a metal layer, partial coating of a graphite surface with a metal layer results in deposition of a diamond film only where the surface is metal coated. As a result, a diamond film is deposited on selected portions of a graphite surface by applying the metal layer to only these portions. Diamond has been deposited in a grid pattern on a graphite surface by applying a non-woven nickel grid or screen to the surface, and it is believed that any desired pattern of diamond may be obtained by masking portions of a graphite surface where diamond is not desired before deposition of the metal layer of the present invention on the graphite surface.

In selective deposition of diamond on graphite using the nickel screen, a non-woven, 70 line-per-inch, screen having 15 μm-diameter grid lines formed of electrolytically deposited nickel was used. Such a screen is commercially available and is supplied between mylar films which are stripped off to apply the nickel screen. The screen was attached to the substrate at its edges by the above described graphite adhesive. Following diamond deposition in accordance with the present invention, a grid of diamond film was found to have replaced the nickel grid lines. Such nickel screens were effective in accordance with the present invention whether adhered to the graphite by melting due to relatively high substrate and plasma temperature or merely rested against the substrate.

It is thus an object of the present invention to provide a method for nucleation of diamond crystallites on graphite and for deposition of a continuous; adhering film of polycrystalline diamond on graphite.

Another object is to provide a method for deposition of polycrystalline diamond on a graphite substrate having a temperature substantially less than 850° C.

A further object is to deposit such a diamond film on graphite in a predetermined pattern.

DETAILED DESCRIPTION

In accordance with the present invention, CVD diamond films were grown by microwave-assisted chemical vapor deposition using equipment similar to that described and shown in U.S. Pat. No. 5,169,676 issued to the present applicants on 8 Dec. 1992 and hereby incorporated by reference. This equipment included an Astex microwave reactor system having a 1.5-kW microwave generator, rf-induction substrate heater, and six computer-controlled mass-flow controllers. A vacuum pumping system consisting of a Leybold-Hereaus Trivac B, BCS corrosion-resistant pump with PFPE fluid was utilized and ultimate chamber vacuum was $1 \times 10^{-4}$ torr with pressure monitoring and control accomplished, respectively, by MKS Baratron capacitance manometers and throttle valve. Absolute pressure was monitored using a Granville-Phillips convection gauge and a Varian 564 extended-range ionization gauge.

Substrate temperatures were determined by optical-pyrometer measurements and a thermocouple embedded in the heated substrate stage. Initial experiments used rf-induction-heating of the stage to maintain the substrate at 650° C. It later was determined that plasma heating of the substrate alone was adequate to initiate and maintain diamond growth. With the rf-induction heater turned off and the microwave power set at 1100 watts, the thermocouple embedded in the substrate stage indicated a temperature of approximately 400° C. In addition, diamond films were grown successfully with microwave power set between 900 and 1300 watts. Although diamond successfully grew on unabraded surfaces, most of the substrates were abraded prior to deposition to enhance the uniformity of the diamond films.

The total chamber pressure was 45 torr. Methane in concentrations of 0.5 to 3% in hydrogen was the hydrocarbon source for the diamond. Oxygen in concentrations of 0.25 to 1% was added to the feedstock to lower the graphitic content of the films and to promote diamond growth. The carbon-to-oxygen ratio was kept between 1 and 3. Total gas flow ranged from 200 to 300 sccm.

A Raman spectrum of a diamond film grown using the present invention shows a peak centered at about 1331 $cm^{-1}$ with a FWHM of 5.3 $cm^{-1}$ and indicates good optical-quality diamond while the absence of a broad peak in the 1500 $cm^{-1}$ region indicates that the film contains little non-diamond carbon.

Certain of the graphite substrates were masked so that only half of the substrate surface was coated with the chromium, titanium or nickel metal layer of the present invention. Abraded and non-abraded samples of each substrate material were subjected in separate runs to identical diamond deposition conditions with the substrate temperature at 650° C. With the electrically conducting material graphite, both pyrolytic and prepared as described below from graphite adhesive, there was high diamond nucleation density with some voids on the metal coated half of the abraded graphite substrate. On the bare side of the abraded graphite, the diamond nucleation density was high near the edge of the metal layer film and dropped off rapidly to only scattered crystallites near the edge of the sample farthest from the metal layer. That is, diamond film deposition in accordance with the present invention produced continuous diamond films only on the metal coated half of these substrates.

The effect of an electrical potential bias between a substrate, on which diamond nucleation and growth occurs in accordance with the present invention, and the wall of a vacuum chamber, which contains the substrate and a plasma contacting the substrate and activated by microwave energy from a mixture of hydrogen and methane, was investigated to determine changes in the diamond nucleation and growth rate due to variations in the bias as shown in the following examples, particularly Example 3 and Examples 7 through 10.

Growth rates and nucleation densities are similar to those obtained on semiconducting substrates like silicon with the higher temperature deposition processes of the prior art. The present invention thus avoids difficulties associated with prior art diamond CVD deposition due to thermal expansion mismatch and to diffusion and thermal decomposition of materials added to a graphite substrate.

As before stated, Auger spectroscopy and Rutherford backscattering spectrometry (RBS) indicate less than 0.2 atomic weight percent of metal contamination at the substrate/diamond film interface. Secondary ion mass spectroscopy (SIMS) depth-profiling measurements may confirm even lower low levels of metal contamination at the interface and through the bulk of the diamond film.

A particularly significant use of the present invention is to deposit CVD diamond films disposed on graphite in predetermined patterns. It is evident that such patterning need not be restricted to planar substrates and may use integrated circuit techniques for masked deposition of metal to define patterns of continuous diamond films to be deposited on graphite in accordance with the present invention. It is apparent that this invention may be used for diamond crystallite nucleation and deposit of adherent, high-quality diamond films as required to provide CVD diamond technology on graphite substrates for other and presently completely novel applications.

EXAMPLES

In the following examples, substrates and metal coatings were prepared as follows:

The graphite adhesive substrates were 1.0 inch diameter and 0.125 inch thick and were fabricated from Cotronics 931 graphite adhesive obtained from Cotronics Corp of Brooklyn, N.Y. One hundred parts graphite powder was mixed with 35 parts binder by weight make a thick creamy paste which was placed into teflon molds and cured for 4 hours at 100° C., and then for 16 hours at 130° C. This procedure forms nearly 100% graphite bonds. The graphite substrates were then released from the molds and polished to a smooth finish.

The pyrolytic graphite substrates were obtained from Industrial Graphite Products, Inc. of Bensenville, Ill., and were discs 1.0 inch diameter and 0.094" thick with a ground smooth surface on both sides.

The chromium metal films were reactively sputtered in a DC magnetron system from a 99.999% purity chromium target. Total gas pressure was 2 millitorr of pure argon. Forward power was 0.5 kilowatts giving a deposition rate of 60 Å/min. The substrates were unheated.

The nickel metal films were deposited in an Ion Tech ion beam sputtering system from a 99.95% purity nickel metal target using pure argon at a total gas pressure of was $3 \times 10^{-4}$ torr. Ion energy in the beam was 1000 eV with a beam current of 45 milliamps. Deposition rate was 30 Å/min.

The copper metal films were reactively sputtered in a DC magnetron system from a 99.999%, purity copper target. Total gas pressure was 2 millitorr of pure argon.

Forward power was 0.5 kilowatts giving a deposition rate of 60 Å/min. The substrates were unheated.

The titanium metal films were deposited in an Ion Tech ion beam sputtering system from 99.995% purity titanium metal target. Total gas pressure was $3 \times 10^{-4}$ torr of pure argon. Ion energy in the beam was 1000 eV with a beam current of 45 milliamps. Deposition rate was 30 Å/min.

In the following examples diamond film deposition parameters and conditions were the same as in example 1 except as noted.

Example 1

A 1.0-inch-diameter pyrolytic graphite substrate was abraded with 0–0.5 micron synthetic diamond grit for 20 minutes. The surface was then wiped with a lint free cloth to remove any loose particles.

Diamond Film Deposition Parameters forward microwave power: 900 watts reflected microwave power: <1 watt hydrogen flow rate: 186.3 sccm methane flow rate: 2.5 sccm oxygen flow rate: 0.85 sccm reactor total pressure: 45 torr substrate temperature: 650° C.

The substrate was brought up to 850° C. temperature and was vacuum pumped for 20 minutes. The hydrogen was introduced into the chamber and the chamber pressure was set to 15 torr. Once the chamber reached 15 torr, the microwave power was turned on at 700 watts to initiate the plasma ball.

The pressure was than adjusted to 45 torr; the microwave power set to 900 watts; and the microwave; tuning stubs adjusted to minimize reflected microwave power. The methane and oxygen were added to the feedstock and the deposition continued for 8 hours.

After the 8 hour deposition, the methane and oxygen feeds were turned off. The hydrogen only plasma was allowed to run to 15 minutes. The microwave and substrate heater power were then turned off and the substrate allowed to cool to room temperature. There were a few, random diamond crystallites of about 2 to 5 micron diameter on the edge of the pyrolytic graphite substrate and some in large polishing scratches in the center. The majority of the central area did not have any diamond crystallites.

Example 2

The same procedure as example 1 was followed with a graphite adhesive substrate. The results were the same.

Example 3

A pyrolytic graphite substrate was coated with 300 Å of chromium metal as described above. The chromium metal coating was then diamond abraded with 0–0.25 micron diamond particles for 20 minutes and then wiped clean.

Diamond deposition was carded out as in example 1. At the end of the 8 hours, a nearly continuous diamond coating was deposited on the chrome coated pyrolytic graphite substrate. There were some areas of voids. In some of the voids the chromium coating could be seen. The chromium had changed color for silvery metallic to gold colored indicating the possible presence of chromium carbide.

Example 4

A graphite adhesive substrate was coated with 300 Å of chromium metal as described above. The chromium metal coating was then diamond abraded with 0–0.25 micron diamond particles for 20 minutes and then wiped clean.

Diamond deposition was carried out as in example 1. The results were the same as example 3, except there were more void areas in the diamond film. The surfaces of the graphite adhesive substrates were more rough than those of pyrolytic graphite so that the chromium coating may not have adhered as well to graphite adhesive graphite substrates as to those of pyrolytic graphite.

Example 5

A pyrolytic graphite substrate was coated with 2500 Å of chromium metal as described above. The chromium metal coating was then diamond abraded with 0–0.25 micron diamond particles for 20 minutes and then wiped clean.

Diamond deposition was carded out as in example 1. At the end of the 8 hours, a continuous diamond coating was deposited on the chromium coated pyrolytic graphite substrate. There were only a couple of void areas present in the diamond film near one edge. The diamond crystallite sizes ranged from one to two microns in diameter.

A graphite adhesive substrate was coated with 2500 Å of chromium metal as described above. The chromium metal coating was then diamond abraded with 0–0.25 micron diamond particles for 20 minutes and then wiped clean.

Diamond deposition was carried out as in example 1. At the end of the 8 hours, a nearly continuous diamond coating was deposited on the chromium coated graphite adhesive substrate. There were more void areas than the pyrolytic graphite substrate but much fewer than example 4. The diamond crystallite sizes ranged from one to five microns in diameter.

Example 7

A pyrolytic graphite substrate was coated with 2500 Å of chromium metal as described above. The chromium metal coating was then diamond abraded with 0–0.25 micron diamond particles for 20 minutes and then wiped dean.

Diamond deposition was carded out as in example 1 except that a +25 V bias was applied to the substrate stage. At the end of the 8 hours, a continuous diamond coating was deposited on the chromium coated pyrolytic graphite substrate. There were no voids present. The diamond crystallite sizes ranged from submicron to one micron in diameter.

Example 8

A pyrolytic graphite substrate was coated with 2500 Å of chromium metal as described above. The chromium metal coating was then diamond abraded with 0–0.25 micron diamond particles for 20 minutes and then wiped clean.

Diamond deposition was carried out as in example 1 except that a −25 V bias was applied to the substrate stage. At the end of the 8 hours, only sparse diamond crystallites were present on the slightly etched chromium coating.

Example 8

A graphite adhesive substrate was coated with 2500 Å of chromium metal as described above. The chromium metal coating was then diamond abraded with 0–0.25 micron diamond particles for 20 minutes and then wiped clean.

Diamond deposition was carried out as in example 1 except that a +25 V bias was applied to the substrate stage. At the end of the 8 hours, a continuous diamond coating was deposited on the chromium coated graphite adhesive graphite. There were no voids present. The diamond crystallite sizes ranged from submicron to two microns in diameter.

Example 10

A pyrolytic graphite substrate was coated with 2500 Å of nickel metal as described above. The nickel metal coating was then diamond abraded with 0–0.25 micron diamond particles for 20 minutes and then wiped clean.

Diamond deposition was carded out as in example 1 except that a +25 V bias was applied to the substrate stage. At the end of the 8 hours, a continuous diamond coating was deposited on the nickel coated pyrolytic graphite substrate. There were no voids present. The diamond crystallite sizes ranged from submicron to one micron in diameter.

Example 11

A graphite adhesive substrate was coated with 2500 Å of nickel metal as described above. The nickel metal coating was then diamond abraded with 0–0.25 micron diamond particles for 20 minutes and then wiped clean.

Diamond deposition was carried out as in example 1 except that a +25 V bias was applied to the substrate stage. At the end of the 8 hours, a continuous diamond coating was deposited on the nickel coated graphite adhesive substrate. There were no voids present. The diamond crystallite sizes ranged from submicron to two microns in diameter.

Raman spectra were taken of the diamond film and the graphite adhesive substrate. The Raman spectrum of the diamond showed a single peak at 1324 cm$^{-1}$ which is consistent with highly stressed diamond since stresses in diamond can cause a shift to a lower wavenumber from the usual Raman peak centered at 1332 cm$^{-1}$ for polycrystalline diamond.

A section of the diamond film was removed, and the portion of the graphite substrate that was just beneath the diamond exhibited the crystalline graphite Raman spectrum with a sharp peak centered at 1580 cm$^{-1}$, a change from the initial graphite surface spectrum which had the broad peak centered at 1520 cm$^{-1}$ consistent with amorphous graphite. Apparently, application of the nickel coating and CVD diamond film deposition as set forth above had changed the top surface of the amorphous graphite to crystalline graphite. This crystalline graphite may have facilitated nucleation of diamond on the graphite.

Example 12

A pyrolytic graphite substrate was coated with 30 Å of copper metal as described above and the copper coating was then covered with 2500 Å of chromium metal. The chromium metal coating was then diamond abraded with 0–0.25 micron diamond particles for 20 minutes and then wiped clean.

Diamond deposition was carded out as in example 1 except that a +25 V bias was applied to the substrate stage. At the end of the 8 hours, a continuous diamond coating was deposited on the copper and chromium coated pyrolytic graphite substrate. There were some pinholes present.

The diamond crystallite sizes ranged from submicron to two microns in diameter.

Example 13

A pyrolytic graphite substrate was coated with 2500 Å of titanium metal as described above.

The titanium metal coating was then diamond abraded with 0–0.25 micron diamond particles for 20 minutes and then wiped clean.

Diamond deposition was carded out as in example 1 except that a +25 volt bias was applied to the substrate stage. At the end of the 8 hours, a continuous diamond coating was deposited on the titanium coated pyrolytic graphite substrate. There were some pinholes present. The diamond crystallite sizes ranged from submicron to one micron in diameter.

Example 14

A graphite adhesive substrate was coated with 30 Å of copper metal as described above and the copper coating was then covered with 2500 Å of chromium metal as described above. The chromium metal coating was then diamond abraded with 0–0.25 micron diamond particles for 20 minutes and then wiped clean.

Diamond deposition was carded out as in example 1, and the results were the same as example 12.

Example 15

To demonstrate patterning of diamond film on graphite by use of the present invention, a non-woven, 70 line-per-inch electrolytic nickel screen was place over a substrate of graphite adhesive prior to diamond deposition. The screen was held in position by tacking the edges with uncured graphite adhesive which was then cured by the procedure described above.

Diamond deposition conditions were the same as in example 1. After 4 hours deposition, diamond had nucleated and a film with crystallites in a range of one to five microns in size had grown on the substrate where the nickel lines of the screen were positioned. However, the bare graphite areas between these lines had only a few random crystallites.

Example 16

A pyrolytic graphite substrate was coated with 300 Å of copper metal as described above. The copper metal coating was then diamond abraded with 0–0.25 micron diamond particles for 20 minutes and then wiped clean.

Diamond deposition was carded out as in example 1. At the end of the 8 hours there were a few random diamond crystallities of about 2 to 5 micron diameter on the edge of the copper coated pyrolytic substrate and some in large poslishing scratches in the center. The majority of the central area did not have any diamond crystallites.

It is apparent that many modifications and variations of the present invention are possible in light of the above teachings. It is, therefore, to be understood that the present invention may be practiced within the scope of the following claims other than as described above.

What is claimed is:

1. A method of depositing diamond on graphite, the method comprising:

constructing a substrate having a graphite surface;

applying a layer of a metallic element on said surface; and subjecting said substrate to a plasma activated from a mixture of hydrogen and a gas containing carbon, so that the diamond is deposited from said plasma at said layer and on said surface in a continuous film of polycrystalline diamond adhering to said surface, said metallic element forming a carbide and said layer of a metallic element having a thickness such that:

crystallites of said carbide nucleate at said layer from said metallic element in said layer and from said carbon in said plasma;

crystallites of diamond nucleate on said crystallites of said carbide;

said plasma erodes away any of said metallic element remaining in said layer and not nucleated as said crystallites of said carbide; and said continuous film of polycrystalline diamond grows from said crystallites of diamond and is deposited substantially directly on said surface.

2. A method of depositing diamond on graphite, the method comprising:

constructing a substrate having a graphite surface;

applying a layer of a metallic element on said surface; and subjecting said substrate to a plasma activated from a mixture of hydrogen and a gas containing carbon, so that the diamond is deposited from said plasma at said layer and on said surface in a continuous film of polycrystalline diamond adhering to said surface, said graphite surface initially being amorphous graphite and after said substrate is subjected to said plasma, said amorphous graphite at said surface and at said layer of a metallic element applied to said surface forms crystalline graphite facilitating nucleation of diamond crystallites at said surface from said plasma.

3. A method of depositing diamond on a surface of amorphous graphite by subjecting said substrate to a plasma activated from a mixture of hydrogen and a gas containing carbon, the method comprising:

applying a metal to said surface, said metal being applied in a thickness such that at least a portion of said metal is nucleated at said surface as crystallites of the carbide of said metal by carbon from said plasma and said metal not nucleated at said surface as said carbide of said metal is substantially eroded from said surface by said plasma when said substrate is initially subjected to said plasma; and continuing to subject said substrate to said plasma so that crystallites of diamond are nucleated at said surface by carbon from said plasma and additional diamond is deposited on said surface in a continuous film of polycrystalline diamond adhering to said surface.

4. The method of claim 3 wherein said substrate is at a temperature not exceeding about 850° C. while said substrate is initially subjected to said plasma.

5. The method of claim 3 wherein said metal is applied to a predetermined region of said surface before activation of said mixture so that, after subjecting said substrate to said plasma, said continuous film of polycrystalline diamond is deposited on said surface only at said region.

6. The method of claim 3 wherein said metal is applied to said substrate by a method selected from the group consisting of adhesively adhering said metal to said substrate, melting said metal onto said substrate, DC magnetron deposition, and ion beam deposition.

* * * * *